United States Patent [19]

Brock

[11] 4,180,416
[45] Dec. 25, 1979

[54] THERMAL MIGRATION-POROUS SILICON TECHNIQUE FOR FORMING DEEP DIELECTRIC ISOLATION

[75] Inventor: Geoffrey E. Brock, Mount Kisco, N.Y.

[73] Assignee: International Business Machines Corporation, Armonk, N.Y.

[21] Appl. No.: 946,007

[22] Filed: Sep. 27, 1978

[51] Int. Cl.² .................. H01L 21/228; C25F 3/00
[52] U.S. Cl. ................... 148/1.5; 148/171; 148/177; 148/187; 204/129.3
[58] Field of Search ............... 148/1.5, 171, 177, 187; 204/129.3

[56] References Cited

U.S. PATENT DOCUMENTS

| | | | |
|---|---|---|---|
| 3,899,361 | 8/1975 | Cline et al. | 148/1.5 |
| 3,899,362 | 8/1975 | Cline et al. | 148/1.5 |
| 3,919,060 | 11/1975 | Pogge et al. | 204/129.3 |
| 3,972,754 | 8/1976 | Riseman | 148/175 |
| 3,979,230 | 9/1976 | Anthony et al. | 148/1.5 |
| 3,988,619 | 10/1976 | Malaviya et al. | 307/311 |
| 3,998,661 | 12/1976 | Chang et al. | 148/1.5 |
| 3,998,662 | 12/1976 | Anthony et al. | 148/1.5 |
| 4,001,047 | 1/1977 | Boah | 148/1.5 |
| 4,028,149 | 6/1977 | Deines et al. | 148/175 |
| 4,104,786 | 8/1978 | Boah et al. | 29/583 |

Primary Examiner—G. Ozaki
Attorney, Agent, or Firm—Robert J. Haase

[57] ABSTRACT

A method for forming deep dielectric isolation regions of uniform porous silicon dioxide in silicon wafers having 100 face planes. Subcollector regions of one conductivity type are placed in a silicon substrate of opposite conductivity type. The substrate is covered by an epi layer of the opposite conductivity type. Isolation patterns of heavily doped impurity of the substrate conductivity type are thermally migrated along 110 and 1$\bar{1}$0 crystallographic planes deeply and uniformly through the epi layer and into the substrate between the subcollector regions. The doped isolation patterns are converted to porous silicon by anodic treatment, and the porous silicon is converted into porous silicon dioxide by exposure to an appropriate oxidizing atmosphere.

13 Claims, 6 Drawing Figures

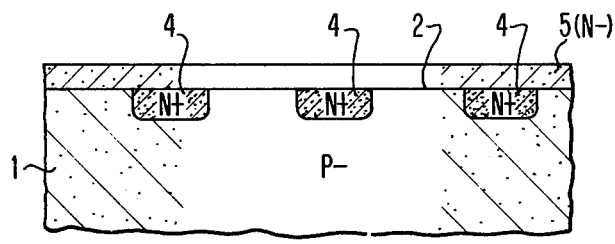
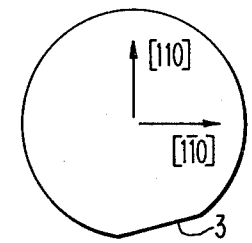
FIG. 1  FIG. 1A
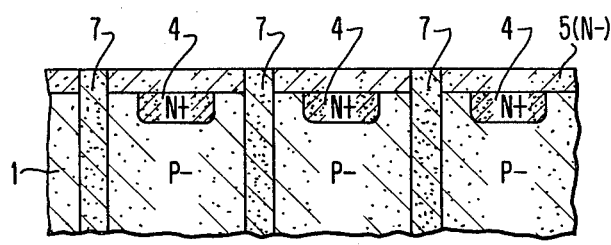
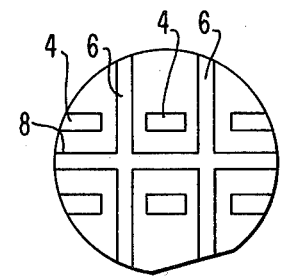
FIG. 2  FIG. 2A
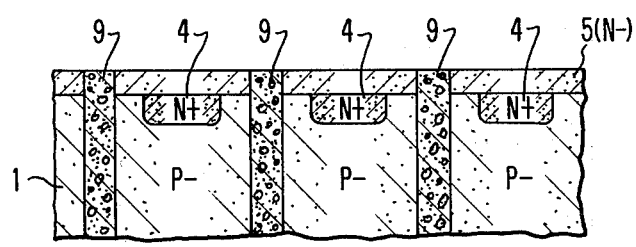
FIG. 3
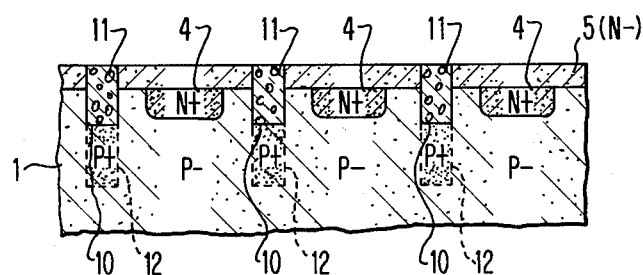
FIG. 4

THERMAL MIGRATION-POROUS SILICON TECHNIQUE FOR FORMING DEEP DIELECTRIC ISOLATION

DESCRIPTION

Technical Field

The invention relates to a method for forming dielectric isolation in semiconductor wafers and, more particularly, to a thermal migration, anodizing and oxidizing method producing patterned isolation of improved uniformity.

Background

U.S. Patent 3,919,060, issued November 11, 1975 to H. Bernhard Pogge et al. for "Method of Fabricating Semiconductor Device Embodying Dielectric Isolation" and assigned to the present assignee, describes a porous silicon method for producing dielectrically isolated silicon regions. The porous silicon is formed in a silicon body by the diffusion or ion implantation of high conductivity regions conforming to the desired isolation pattern and then anodically etching the high conductivity regions. The porous silicon is oxidized to produce the desired isolation regions. In those situations where deep isolation regions are required, it is necessary that the diffusion be done over a long time at relatively high temperatures. The result is a graded impurity profile in the semiconductor body which tends to convert to non-uniform porous silicon and, subsequently, non-uniform porous silicon dioxide isolation. The tendency toward non-uniform porous silicon dioxide isolation is minimized or avoided, in accordance with the present invention, by forming the high conductivity regions using a thermal migration, rather than a diffusion process. Thermal migration processes of interest to the present invention, are disclosed in U.S. Pat. Nos. 3,979,230 to Thomas R. Anthony et al., issued Sept. 7, 1976, for "Method of Semiconductor Material" and in U.S. Pat. No. 3,998,662 to Thomas R. Anthony et al., issued Dec. 21, 1976, for "Migration of Fine Lines for Bodies of Semiconductor Materials Having a (100) Planar Orientation of a Major Surface," for example.

BRIEF DESCRIPTION OF DRAWINGS

FIGS. 1, 1A, 2, 2A, 3 and 4 are simplified cross-sectional views of a preferred embodiment of the present invention at successive stages during fabrication.

DISCLOSURE OF INVENTION

Referring to FIG. 1, P-type substrate 1 has a major surface 2 lying in the (100) crystallographic plane. Substrate 1 is doped to a value of $10^{15}$ atoms/cm, P-type impurity. Crystallographic directions [110] and [1$\bar{1}$0] lie in the (100) plane as shown in the plan view of FIG. 1A. A flat edge 3 has previously been formed on substrate wafer 1 in order to identify the crystallographic directions [110] and [1$\bar{1}$0] during subsequent wafer fabrication.

Wafer 1 is thermally oxidized to produce a surface layer (not shown) of the order of 1600 Å thickness of silicon dioxide. Using standard lithography techniques, windows are cut through the oxide layer to form a subcollector diffusion mask. The mask is oriented so that the edges of the subcollector windows are parallel to the [110] and [1$\bar{1}$0] crystallographic directions. The subcollector is formed in a conventional manner, using either thermal diffusion or ion implantation techniques, to produce regions 4 containing typically $10^{20}$ atoms/cm of an N-type dopant, for example, arsenic. By conventional epitaxial deposition technique, an N-type silicon layer 5 of about $5 \times 10^{16}$ atoms/cc concentration and approximately 2 to 6 microns in thickness is grown on top of the subcollector diffused substrate 1.

A grid structure of aluminum lines next is formed on the surface of epitaxial layer 5 to delineate the dielectric isolation regions to be formed later in substrate 1. The grid structure is defined in two steps. In the first step, aluminum lines are formed either by standard lithographic processing and subtractive etching or by a lift-off technique, the lines running between the subcollector regions 4 in a [110] direction. The aluminum preferably is electron beam evaporated on epitaxial layer 5 to a thickness of between 3 to 5 microns. Photoresist is applied to the aluminum, exposed and developed. The aluminum is etched using the developed mask to leave the aluminum lines 6 running in the [110] direction on the surface of epitaxial layer 5 between subcollector regions 4 as shown in FIG. 2A.

The wafer then is placed in a conventional thermal migration apparatus as described, for example, in the cited Anthony et al. patents, and the aluminum lines are thermally migrated completely through the wafer to produce P-doped regions 7 of FIG. 2. Inasmuch as the thermal migration process yields the solid solubility concentration limit of the P-dopant throughout the entire thermal migration path, a substantially uniform level of P-type impurity concentration is produced within the regions 7.

Aluminum lines again are formed on the surface of the epitaxial layer 5. This time, the lines are formed running in a [1$\bar{1}$0] crystallographic direction. Again, the aluminum preferably is electron beam evaporated on epitaxial layer 5 to a thickness of between 3 to 5 microns. A photoresist mask is formed and the aluminum is etched using the developed mask to leave the aluminum lines 8 running in the [1$\bar{1}$0] direction on the surface of epitaxial layer 5 between subcollector regions 4 as shown in FIG. 2A. Then, the wafer is placed in the thermal migration apparatus and the aluminum lines are thermally migrated completely through the wafer to produce P-doped regions (not shown) similar to region 7 of FIG. 2 but running in orthogonal directions relative thereto. The structure now consists of a matrix of uniformly heavily doped P-type regions delineating the locations of the ultimately desired silicon dioxide isolating regions.

The high conductivity P-type regions now are anodized in an H.F. solution to convert the silicon in these regions to a porous silicon structure. Typically, a 12% aqueous H.F. solution is used at room temperature for about 20 minutes at a current density of about 30 milliamperes. Then, the wafer is heated for about 30 minutes at approximately 970° C. in steam to convert the porous silicon areas to porous silicon dioxide areas 9 of FIG. 3. As a result of the oxidation step, the surface of the wafer also will be covered by approximately 1500 Å of oxide which can be used subsequently as a mask for introducing impurities into the structure to form isolated semiconductor devices in the epitaxial layer 5 as is desired. In the embodiment of the present invention discussed in connection with FIGS. 1, 2 and 3, it is to be understood that the thermal migration process is carried out until the P-dopant material from the aluminum line matrix penetrates fully through the wafer 1 from the upper principal surface 2 to the lower principal surface (not shown). As is well understood in the art, the thermal migration process utilizes a thermal gradient zone melting technique wherein a molten zone of a metal-rich semiconductor material such as, for example, aluminum-rich silicon, is moved through the body of semiconductor material. In the embodiment of the present invention shown in FIG. 4, however, the thermal gradient zone melting process is practiced only until the molten zone of aluminum-doped silicon reaches the depth of line 10. Then, the thermal gradient is reversed and the molten zone is moved back through the body 1 substantially along the same path to the surface 2. The restricted depth porous silicon dioxide regions 11 result in this case after the thermally migrated P-type impurity zones have been anodized (to provide porous silicon) and oxidized (to provide porous silicon dioxide).

Alternatively, the thermal migration process may be continued until the thermally migrated P-type dopant material has penetrated completely throughout the wafer 1 structure portion shown in FIG. 4 by the dashed lines 12. By limiting the time of the anodizing step so that only the P impurity region above line 10 is anodized, the subsequent oxidation step will produce only the restricted depth silicon dioxide region 11 shown in FIG. 4. The unoxidized region below line 10 and between the dashed line 12 in FIG. 4 will remain heavily P-doped providing channel-stop regions beneath each of the silicon dioxide regions 11 so as to preclude the formation of undersired inversion channels that might otherwise appear underneath the silicon dioxide regions 11 in the P- substrate material 1.

Although in the foregoing specification, a silicon wafer having a major surface in the (100) plane was described, other wafer surface orientations can be used as discussed in the cited Anthony et al. patents. Additionally, thermal migration directions other than [110] and [1$\bar{1}$0] may be used by correspondingly orienting the direction of the deposited aluminum lines, again as discussed in the aforesaid patents. Moreover, materials other than aluminum may be employed as the dopant source for thermal migration. Suitable N-type dopant materials for silicon are phosphorus, arsenic and antimony. Suitable P-type dopant materials for silicon are boron, aluminum, gallium and indium. Any excess thermal migration dopant material that remains on either surface of the semiconductor wafer upon completion of the migration process must be removed by an appropriate etchant prior to undertaking the anodization and oxidation process steps.

While I have illustrated and described the preferred embodiments of my invention, it is to be understood that I do not limit myself to the precise constructions herein disclosed and the right is reserved to all changes and modifications coming within the scope of the invention as defined in the appended claims.

Having thus described my invention, what I claim as new, and desire to secure by Letters Patent is:

1. The method for forming dielectric isolation comprising:
   providing a body of monocrystalline silicon semiconductor,
   depositing metal on the surface of said body in a desired pattern of isolation regions for the said monocrystalline silicon body,
   heating the body and the deposited metal to form a melt of a metal-rich semiconductor material therein,
   migrating each melt of metal-rich semiconductor material as a molten zone into said body of semiconductor material to form regions having substantially uniform impurity concentration of a type determined by the impurity type of said metal,
   converting at least a portion of said regions into a porous silicon substance by anodic treatment, and providing an atmosphere to convert said porous silicon substance into a dielectric isolating material.

2. The method defined in claim 1 wherein said metal is aluminum.

3. The method defined in claim 2 wherein said aluminum is deposited to a thickness of about 3 to 5 microns.

4. The method defined in claim 2 wherein said aluminum is electron beam evaporated on the surface of said body.

5. The method defined in claim 2 wherein said aluminum is electron beam evaporated on the surface of said body to a thickness of about 3 to 5 microns.

6. The method defined in claim 1 wherein said body of monocrystalline silicon semiconductor has a major surface lying in the (100) plane, and said pattern of isolation regions comprises a series of parallel lines in the [110] direction.

7. The method defined in claim 1 wherein said body of monocrystalline silicon semiconductor has a major surface lying in the (100) plane, and
   said pattern of isolation regions comprises a series of parallel lines in the [1$\bar{1}$0] direction.

8. The method defined in claim 1 wherein said body of monocrystalline silicon semiconductor has a major surface lying in the (100) plane, and said pattern of isolation regions comprises a matrix of orthogonal lines lying along the [110] and [1$\bar{1}$0] directions.

9. The method defined in claim 1 wherein said melt of metal-rich semiconductor material is migrated completely through said body of semiconductor material.

10. The method defined in claim 1 wherein said melt of metal-rich semiconductor material is migrated only partially through said body of semiconductor material.

11. The method defined in claim 1 wherein said body of semiconductor material comprises an epitaxial layer on said substrate being of opposite conductivity types.

12. The method defined in claim 11 wherein said melt of metal-rich semiconductor material is migrated completely through said epitaxial layer and at least partially through said substrate.

13. The method defined in claim 11 wherein said epitaxial layer is about 2 to 6 microns thick.

* * * * *